United States Patent
Lee et al.

(10) Patent No.: US 10,033,155 B2
(45) Date of Patent: Jul. 24, 2018

(54) CIRCUIT AND METHOD OF OPERATING A LASER DIODE

(71) Applicant: STMICROELECTRONICS (RESEARCH & DEVELOPMENT) LIMITED, Marlow (GB)

(72) Inventors: Denise Lee, Edinburgh (GB); John Kevin Moore, Edinburgh (GB)

(73) Assignee: STMICROELECTRONICS (RESEARCH & DEVELOPMENT) LIMITED, Marlow (GB)

(*) Notice: Subject to any disclaimer, the term of this patent is extended or adjusted under 35 U.S.C. 154(b) by 0 days.

(21) Appl. No.: 15/359,706

(22) Filed: Nov. 23, 2016

(65) Prior Publication Data

US 2018/0145482 A1    May 24, 2018

(51) Int. Cl.
| | |
|---|---|
| *H01S 5/18* | (2006.01) |
| *H01S 5/183* | (2006.01) |
| *H01S 5/042* | (2006.01) |
| *H01S 5/06* | (2006.01) |
| *H01S 5/062* | (2006.01) |

(52) U.S. Cl.
CPC ............. *H01S 5/183* (2013.01); *H01S 5/042* (2013.01); *H01S 5/06* (2013.01); *H01S 5/06213* (2013.01); *H01S 5/06226* (2013.01)

(58) Field of Classification Search
CPC . H01S 5/042; H01S 5/183; H01S 5/06; H01S 5/062; H01S 5/06213; H01S 5/06226
See application file for complete search history.

(56) References Cited

U.S. PATENT DOCUMENTS

2010/0172385 A1*  7/2010  Groepl ............... H05B 33/0818
                                                      372/38.04

* cited by examiner

*Primary Examiner* — Armando Rodriguez
(74) *Attorney, Agent, or Firm* — Slater Matsil, LLP

(57) ABSTRACT

An embodiment circuit includes a diode having a first terminal coupled to a first reference voltage; a first controllable switch coupled between a second terminal of the diode and a second reference voltage; and a capacitive element having a first terminal coupled to the first reference voltage and a second terminal controllably coupled to the second terminal of the diode.

22 Claims, 5 Drawing Sheets

CIRCUIT AND METHOD OF OPERATING A LASER DIODE

TECHNICAL FIELD

The present disclosure relates generally to diodes, and, in particular embodiments, to a circuit and a method of operating a laser diode.

BACKGROUND

Laser diodes are widely used in high speed data communications. Modulated light from a laser diode may be used to carry information. The modulated light may be transmitted through optical fibers or across free space. For some data formats, when a laser diode emits light the data value is considered a logical one, and when the laser diode is off (e.g. where no light is emitted from the laser) the data value is considered a logical zero.

Vertical cavity surface emitting lasers (VCSELs) are one type of laser diode used in data communication networks. Drive circuitry may provide a VCSEL with sufficient current to turn on, thereby causing the VCSEL to emit light. Likewise, the drive circuitry may remove or prevent current from flowing to or through the VCSEL, thereby causing the VCSEL to turn off and not emit light.

The ability to drive a laser diode to generate a light intensity output has many applications. For example, generating a light intensity output enables the laser diode to encode information for transmission within an optical output signal. Generating a light intensity output also enables the laser diode to encode timed events (e.g. where a positive edge of a pulse denotes a start time) such as in time-of-flight detection where a received signal is used to determine and resolve distances between a target object and the laser diode. As signaling frequencies in high speed data communications increase (e.g. in excess of 1 GHz), it may be desirable to provide a method and a circuit for driving a laser diode to support robust optical communications even with such increases in signaling frequencies.

SUMMARY

In an embodiment, a circuit includes a diode having a first terminal coupled to a first reference voltage; a first controllable switch coupled between a second terminal of the diode and a second reference voltage; and a capacitive element having a first terminal coupled to the first reference voltage and a second terminal controllably coupled to the second terminal of the diode.

In an embodiment, a circuit includes a current source; a laser diode coupled between a first terminal of the current source and a first reference voltage; and a first switch controlled by a first control signal and coupled between a second terminal of the current source and a second reference voltage, the second reference voltage being less than the first reference voltage. The circuit further includes a capacitive element having a first terminal coupled to the first reference voltage; and a second switch having a first terminal coupled to a cathode of the laser diode and a second terminal coupled to a second terminal of the capacitive element. The second switch may be configured to couple the second terminal of the capacitive element to the first reference voltage in response to a second control signal being at a first voltage, and to couple the second terminal of the capacitive element to the cathode of the laser diode in response to the second control signal being at a second voltage different from the first voltage.

In an embodiment, a method includes forward-biasing a laser diode in response to shifting an amplitude of a first control signal provided to a first switch from a first amplitude to a second amplitude and decoupling a terminal of a capacitive element from a cathode of the laser diode in response to holding an amplitude of a second control signal provided to a second switch at the first amplitude when shifting the amplitude of the first control signal to the second amplitude. The method further includes shifting the amplitude of the first control signal from the second amplitude to the first amplitude to prevent current from flowing through the forward-biased laser diode; and shifting the amplitude of the second control signal from the first amplitude to a third amplitude to couple the terminal of the capacitive element to the cathode of the laser diode.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
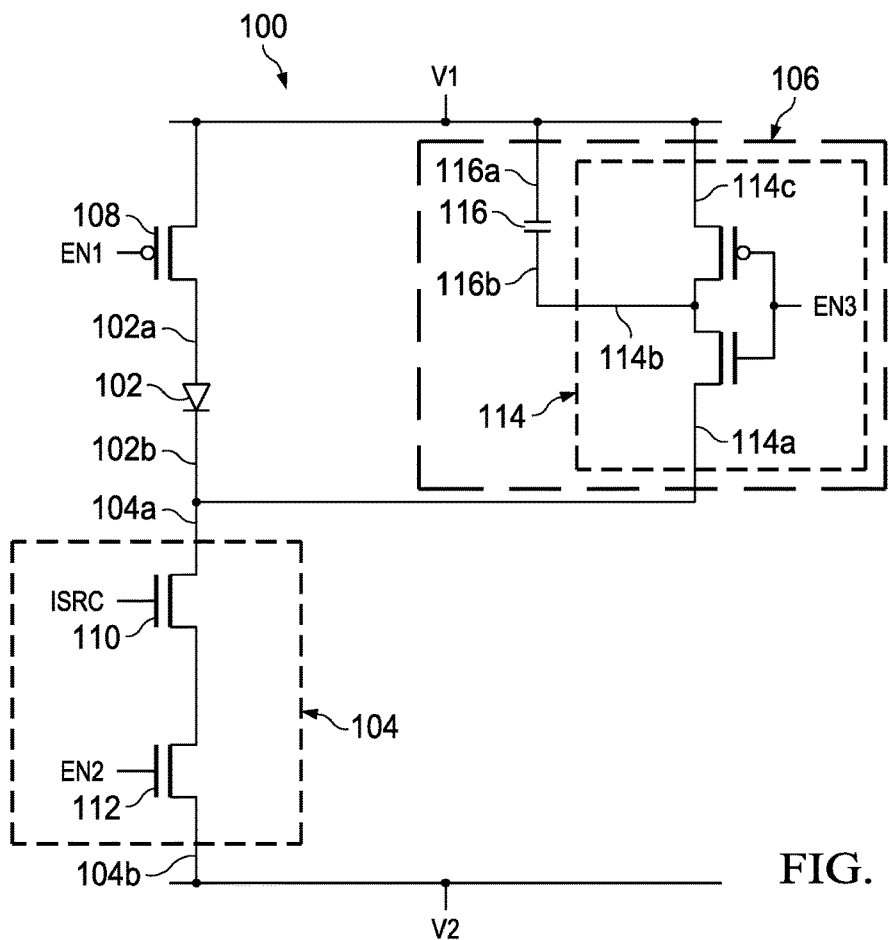
FIG. 1 schematically shows a circuit including a laser diode, a driver circuit, and a snubber circuit, in accordance with an embodiment.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Laser diodes are widely used in high speed data communications. Laser diodes may also be used in a time-of-flight ranging sensor for autofocus, proximity sensing, and object detection in robotics, drone technology, and internet-of-things (IoT) applications. Laser diodes may be driven by driver circuits, and, consequently, operation of such driver circuits may be vital to the performance of a photonic system that includes such laser diodes. As an example, driver circuits may need to effectively and robustly drive laser diodes such that optical output currents from such laser diodes exhibit steep rising edges, steep falling edges, and minimal ringing. Such optical output currents allow laser diodes to support high signaling frequencies (e.g. greater than 1 GHz) and also allow these laser diodes to be used to encode timed events, such as time-of-flight detection and distance resolution (e.g. in proximity sensing or objection detection applications).

Laser diodes may generate light (e.g. infrared light) using an active laser medium that is formed by a p-n junction. The p-n junction may accumulate charged carriers during operation of the laser diode, and such charge accumulation can detrimentally affect the rise time, the fall time, and damping of optical output currents generated by the laser diode. For example, the optical output current generated by the laser diode may have slewed edges and may exhibit ringing as a result of RLC resonance of parasitic elements. These characteristics of the optical output current can result in a current pulse shape that, in turn, can reduce the efficacy of the laser diode in discriminating multiple target determination and can make tight windowing in optical communications more difficult (e.g. in a time window where ambient noise is determined).

As such, it may be desirable to provide a method and circuit for driving laser diodes in a way that compensates for the accumulation of charged carriers in the laser diodes and that decreases the rise time, the fall time, and ringing of optical output currents generated by the laser diode.

An embodiment circuit provides these desirable characteristics. In particular, an embodiment circuit draws out remaining charged carriers within a p-n junction of a laser diode, leading to a rapid turn off time for the laser diode. The embodiment circuit also serves to damp RLC parasitic ringing of an optical output current generated by the laser diode at turn off. The embodiment circuit further allows for a non-zero voltage drop across the laser diode, below the diode's forward biasing voltage, with the laser diode held in a state where it is effectively not emitting light, thereby reducing the need to pre-charge any parasitic node capacitance that exists within the laser diode and its driving circuits (that being any unnecessary excess voltage delta, Q=CV), thus leading to a faster turn-on response for the laser diode. The embodiment circuit additionally allows for charge recovery, where the damped charge removed from the p-n junction of the laser diode is pumped back to the power supply.

FIG. 1 schematically shows a circuit 100 including a laser diode 102, a driver circuit 104, and a snubber circuit 106, in accordance with an embodiment. In some embodiments, the laser diode 102 may be a semiconductor laser (e.g. an electrically pumped semiconductor layer) in which an active laser medium is formed by a p-n junction of a semiconductor diode. In some examples, the laser diode 102 may be a vertical-cavity surface-emitting laser (VCSEL). Other examples of the laser diode 102 include quantum well lasers, quantum cascade lasers, interband cascade lasers, and vertical external-cavity surface-emitting lasers (VECSELs), to name a few.

Laser diode 102 has a first terminal 102a (e.g. the anode) and a second terminal 102b (e.g. the cathode). The first terminal 102a of the laser diode 102 may be coupled to a first reference voltage V1. In the example shown in FIG. 1, the first terminal 102a of the laser diode 102 is coupled to the first reference voltage V1 via a safety switch 108. In the example shown in FIG. 1, the safety switch 108 is implemented using a p-type metal-oxide-semiconductor (PMOS) transistor, although other implementations of the safety switch 108 may be possible in other embodiments.

The second terminal 102b of the laser diode 102 may be coupled to a first terminal 104a of the driver circuit 104. A second terminal 104b of the driver circuit 104 may be coupled to a second reference voltage V2. In some embodiments, the first reference voltage V1 may be a positive supply rail, while the second reference voltage V2 may be a negative supply rail or a ground voltage. As such, the first reference voltage V1 may be greater than the second reference voltage V2.

The safety switch 108 may be configured to electrically decouple the laser diode 102 from the first reference voltage V1 when a fault condition occurs (e.g. when the second terminal 102b of the laser diode 102 is shorted to the first reference voltage V1 or the second reference voltage V2). As an example, a safety control signal EN1 is provided to the safety switch 108 such that the safety switch 108 is closed during normal operation, thereby coupling the laser diode 102 to the first reference voltage V1. However, when a fault condition occurs, the safety control signal EN1 may change amplitude, causing the safety switch 108 to open, thereby decoupling the laser diode 102 from the first reference voltage V1. In the embodiment shown in FIG. 1, the safety control signal EN1 is provided to a gate of the PMOS transistor implementing the safety switch 108. Consequently, in the example of FIG. 1, the safety control signal EN1 is LOW during normal operation, but goes HIGH in response to the occurrence of a fault condition.

As shown in FIG. 1, the circuit 100 includes the driver circuit 104, which is configured to turn the laser diode 102 on and off in response to a first control signal EN2 provided to the driver circuit 104. The driver circuit 104 includes a current source 110 and a first switch 112. In the example shown in FIG. 1, the first terminal 104a of the driver circuit 104 corresponds to a first terminal of the current source 110, and thus, the first terminal of the current source 110 is coupled to the second terminal 102b of the laser diode 102. Furthermore, as depicted in FIG. 1, the first switch 112 is coupled between a second terminal of the current source 110 and the second reference voltage V2. The current source 110 is controlled by a current source control signal ISRC, while the first switch 112 is controlled by the first control signal EN2. In the embodiment depicted in FIG. 1, the current source 110 and the first switch 112 are each implemented using an n-type metal-oxide-semiconductor (NMOS) transistor, although other implementations of the current source 110 and the first switch 112 may be possible in other embodiments. In the example shown in FIG. 1, in order to control the operation of the current source 110 and the first switch 112, the current source control signal ISRC and the first control signal EN2 are respectively provided to the gates of the NMOS transistors implementing the current source 110 and the first switch 112.

For the embodiment shown in FIG. 1, the current source control signal ISRC is HIGH during normal operation, thereby turning on or enabling the current source 110. The current source 110 supplies, to the laser diode 102, a bias current (e.g. a DC current) that is at least equal to a threshold current of the laser diode 102, but less than a lasing threshold of the laser diode 102.

Figure 2:
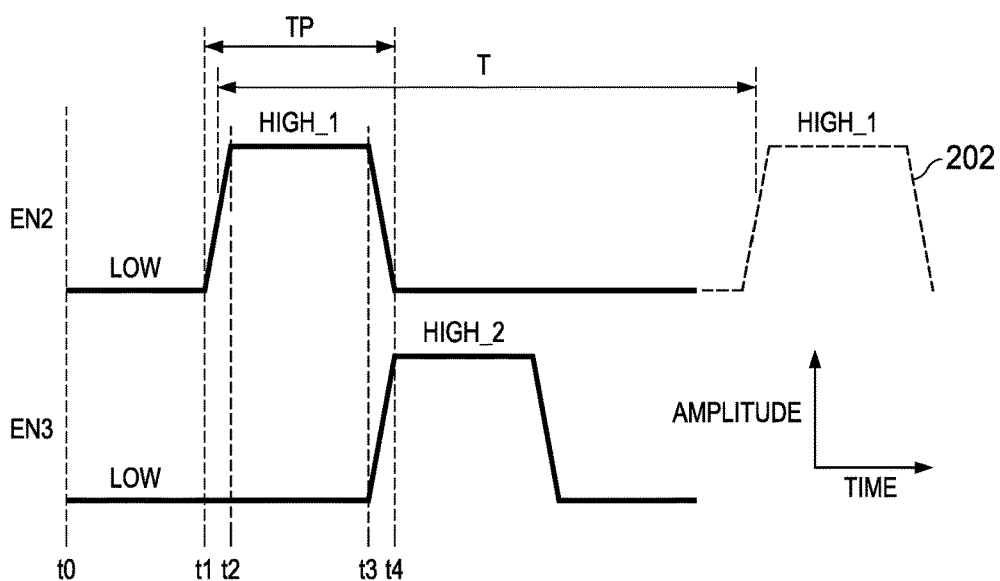
FIG. 2 shows an example control signals respectively provided to the driver circuit and the snubber circuit shown in FIG. 1, in accordance with an embodiment.

FIG. 2 shows an example of the first control signal EN2 provided to the first switch 112 of the driver circuit 104, in accordance with an embodiment. In particular, FIG. 2 shows a variation of the amplitude of the first control signal EN2 with time. As depicted in FIG. 2, from time to time t1, the first control signal EN2 is at a first amplitude (e.g. LOW). In response to the first control signal EN2 being at the first amplitude (e.g. LOW), the first switch 112 is open, thereby decoupling the current source 110 and the laser diode 102 from the second reference voltage V2. As such, current is prevented from flowing through the laser diode 102, regardless of whether the safety switch 108 is closed or whether the current source 110 is enabled. Consequently, the laser diode 102 is turned off and does not emit light between time t0 to time t1.

In response to the first control signal EN2 being at the second amplitude, the first switch 112 is closed, thereby coupling the current source 110 to the second reference voltage V2. Assuming that the safety switch 108 is closed and the current source 110 is enabled, current flows through the laser diode 102 in response to the first control signal EN2 being at the second amplitude (e.g. HIGH_1). As a consequence, the laser diode 102 is turned on and emits light for at least a portion of the time between time t1 and time t3. As described above, the laser diode 102 may be a semiconductor laser (e.g. an electrically pumped semiconductor layer) in which the active laser medium is formed by a p-n junction of a semiconductor diode. As a consequence of the first control signal EN2 transitioning from the first amplitude to the second amplitude (e.g. from time t1 to time t2) and remaining at the second amplitude (e.g. from time t2 to time t3), the p-n junction of the laser diode 102 is forward-biased since the first reference voltage V1 is greater than the second reference voltage V2. This, in turn, drives either holes or electrons or both across the p-n junction of the laser diode 102 so as to "inject" them into active layers of the laser diode 102. This creates an optical output current in the laser diode 102.

Whether light is emitted from the laser diode 102 may depend, at least in part, on whether the optical output current in the laser diode 102 is greater than a lasing threshold, which may be a threshold above which light is emitted from the laser diode 102. In the event that the optical output current in the laser diode 102 is below the lasing threshold, light may not be emitted from the laser diode 102. Conversely, in the event that the optical output current in the laser diode 102 is greater than the lasing threshold, light may be emitted from the laser diode 102.

Assuming that the optical output current in the laser diode 102 is greater than the lasing threshold, the electrons recombine with the holes to produce light, and optical feedback provided by opposite semiconductor layers of the laser diode 102 allows resonance of some of the emitted light to produce coherent "lasing" through a surface (e.g. the top surface or the bottom surface) of the laser diode 102. In some embodiments, the intensity of the light emitted from the laser diode 102 may be proportional to the optical output current flowing through the laser diode 102.

Between time t3 and time t3 the first control signal EN2 transitions from the second amplitude (e.g. HIGH_1) to the first amplitude (e.g. LOW). In some embodiments, the fall time (e.g. the time duration between time t4 and time t3) may be similar to the rise time of first control signal EN2. In response to the first control signal EN2 being at the first amplitude (e.g. LOW), the first switch 112 is open once again, thereby decoupling the current source 110 from the second reference voltage V2. As such, current is prevented from flowing through the laser diode 102, regardless of whether the safety switch 108 is closed or whether the current source 110 is enabled. The laser diode 102 is eventually turned off (e.g. does not emit light) when the current in the laser diode 102 falls below the lasing threshold. The laser diode 102 remains off until a subsequent transition of the first control signal EN2 from the first amplitude to the second amplitude. The subsequent transition of the first control signal EN2 is indicated in FIG. 2 as the pulse labeled 202.

Each of the pulses of the first control signal EN2 resembles a top-hat pulse, and in some embodiments, a signaling frequency of the first control signal EN2 is upwards of 1 GHz. In other words, in some embodiments, a time difference T between rising edges of consecutive pulses of the first control signal EN2 can be less than about 1 ns. In such examples, the total time duration of each pulse of the first control signal EN2 (indicated in FIG. 2 as time duration TP) is less than 1 ns. As such, in order for the driver circuit 104 to drive the laser diode 102 so that higher data rates are effectively and robustly supported, it may be desirable for the optical output current of the laser diode 102 (hereinafter referred to as "output current") to resemble the shape of top-hat pulses of the first control signal EN2. In order for this to occur, the output current of the laser diode 102 may need to have a rise time and a fall time that is comparable or substantially equal to the rise time and the fall time of the pulses of the first control signal EN2.

However, when the laser diode 102 is turned on (e.g. between time t1 and time t3), the p-n junction of the laser diode 102 is forward-biased, and charged carriers are stored at the second terminal 102b of the laser diode 102. Consequently, when the first control signal EN2 transitions from the second amplitude (e.g. HIGH_1) to the first amplitude (e.g. LOW) (e.g. between the time t3 and the time t4), a diffusion capacitance of the p-n junction of the laser diode 102 may act as a parasitic capacitance that opposes the transition from a forward-biased p-n junction to a reverse-biased p-n junction. This parasitic diffusion capacitance of the p-n junction of the laser diode 102 can detrimentally increase the time needed for the current in the laser diode 102 to fall below the lasing threshold, and consequently, the time needed for the laser diode 102 to turn off. In other words, the turn-off time of the laser diode 102 may be substantially greater than the fall time of the first control signal EN2 due to the buildup of charged carriers at the anode of the laser diode 102.

As such, in order to ensure that the output current of the laser diode 102 has a fall time that is comparable or substantially equal to the rise time and the fall time of the pulses of the first control signal EN2, it may be desirable to remove the charged carriers stored at the second terminal 102b of the laser diode 102 when the first control signal EN2 transitions from the second amplitude (e.g. HIGH_1) to the first amplitude (e.g. LOW). Removing the charged carriers stored at the second terminal 102b of the laser diode 102 reduces the parasitic diffusion capacitance of the p-n junction of the laser diode 102. This may, in turn, decrease the turn-off time of the laser diode 102, thereby increasing the maximum data rate the laser diode 102 can support.

Furthermore, it may be desirable to still maintain a non-zero voltage across the laser diode 102 when the laser diode 102 is in the "off" state (e.g. when it is not emitting light). The non-zero voltage across the laser diode 102 when the laser diode 102 is in the "off" state allows the laser diode 102 to be turned on at a faster rate when the first control signal EN2 transitions from the first amplitude (e.g. LOW) to the second amplitude (e.g. HIGH_1) (e.g. between time t1 and time t2). This may, in turn, decrease the turn-on time of the laser diode 102, which can also increase the maximum data rate the laser diode 102 can support.

By implementing both the removal of charged carriers stored at the second terminal 102b of the laser diode 102 when the first control signal EN2 transitions from the second amplitude (e.g. HIGH_1) to the first amplitude (e.g. LOW) and the maintenance of a non-zero voltage across the laser diode 102 when the laser diode 102 is in the "off" state, the rise time and the fall time of the output current of the laser diode 102 can be comparable or substantially equal to the rise time and the fall time of the pulses of the first control signal EN2. This, in turn, can result in the output current of the laser diode 102 resembling the top-hat shape of pulses of the first control signal EN2.

The snubber circuit 106 achieves the above-described removal of charged carriers stored at the second terminal 102b of the laser diode 102 when the first control signal EN2 transitions from the second amplitude (e.g. HIGH_1) to the first amplitude (e.g. LOW). The snubber circuit 106 also achieves the above-described maintenance of a non-zero voltage across the laser diode 102 when the laser diode 102 is in the "off" state. In some embodiments, the snubber circuit 106 is included, on-chip, with the driver circuit 104 and the laser diode 102.

As shown in FIG. 1, the snubber circuit 106 is coupled between the first reference voltage V1 and the second terminal 102b of the laser diode 102. The snubber circuit 106 includes a second switch 114 having a first terminal 114a, a second terminal 114b, and a third terminal 114c. The snubber circuit 106 also includes a capacitive element 116 having a first terminal 116a and a second terminal 116b. In some embodiments, the capacitive element 116 may include one or more capacitors arranged in series or parallel, or both (e.g. such as in a capacitive network). In some embodiments, the capacitive element 116 may be trimmable and may have a plurality of selectable capacitance values. In such embodiments, the capacitive element 116 may assume one or more discrete capacitance values corresponding to the plurality of selectable capacitance values, for purpose of tuning a matching capacitance values, with respect to, lasing diode junction capacitance and/or the interaction of parasitic element, such as bond wire inductance, in obtaining optimal performance/tradeoff.

As depicted in the embodiment of FIG. 1, the first terminal 116a of the capacitive element 116 and the third terminal 114c of the second switch 114 are coupled to the first reference voltage V1. Furthermore, the second terminal 116b of the capacitive element 116 is coupled to the second terminal 114b of the second switch 114. Additionally, the first terminal 114a of the second switch 114 is coupled to the second terminal 102b of the laser diode 102 and the first terminal 104a of the driver circuit 104.

The second switch 114 is configured to controllably couple the capacitive element 116 to the second terminal 102b of the laser diode 102. In particular, the operation of the second switch 114 is controlled by a second control signal EN3. Removal of charged carriers stored at the second terminal 102b of the laser diode 102 when the first control signal EN2 transitions from the second amplitude (e.g. HIGH_1) to the first amplitude (e.g. LOW) and the maintenance of a non-zero voltage across the laser diode 102 when the laser diode 102 is in the "off" state are achieved by dynamically controlling the snubber circuit 106 using the second control signal EN3.

In the example shown in FIG. 1, the second switch 114 includes a PMOS transistor coupled between the second terminal 114b and the third terminal 114c of the second switch 114. The second switch 114 also includes a CMOS transistor coupled between the second terminal 114b and the first terminal 114a of the second switch 114. In particular, in the example shown in FIG. 1, a drain of the PMOS transistor corresponds to the third terminal 114c of the second switch 114; the source of the PMOS transistor and the drain of the CMOS transistor are tied to form the second terminal 114b of the second switch 114; and the source of the CMOS transistor corresponds to the first terminal 114a of the second switch 114.

FIG. 2 shows an example of the second control signal EN3 provided to the second switch 114 of the snubber circuit 106, in accordance with an embodiment. In particular, FIG. 2 shows a variation of the amplitude of the second control signal EN3 with time and relative to the timing of the first control signal EN2. Under the control of the second control signal EN3, the capacitive element 116 is coupled to or decoupled from the second terminal 102b of the laser diode 102. As an example, the second control signal EN3 is provided to the gates of the PMOS and CMOS transistors of the second switch 114. In response to the second control signal EN3 being at a first amplitude (e.g. LOW), the CMOS transistor is turned off while the PMOS transistor is turned on. Consequently, the second terminal 116b of the capacitive element 116 is decoupled from the second terminal 102b of the laser diode 102 when the second control signal EN3 is at the first amplitude (e.g. LOW). On the other hand, in response to the second control signal EN3 being at a third amplitude (e.g. HIGH_2), the CMOS transistor is turned on while the PMOS transistor is turned off. Consequently, the second terminal 116b of the capacitive element 116 is coupled to the second terminal 102b of the laser diode 102 when the second control signal EN3 is at the third amplitude (e.g. HIGH_2).

As shown in FIG. 2, the falling edge of the first control signal EN2 is temporally aligned with (e.g. synchronized with) the rising edge of the second control signal EN3. As an example, at time t3, the first control signal EN2 transitions from the second amplitude (e.g. HIGH_1) to the first amplitude (e.g. LOW), while the second control signal EN3 transitions from the first amplitude (e.g. LOW) to the third amplitude (e.g. HIGH_2). At time t4, the first control signal EN2 reaches the first amplitude (e.g. LOW), while the second control signal EN3 reaches the third amplitude (e.g. HIGH_2).

A result of the relative timings of the first control signal EN2 and the second control signal EN3 is that charged carriers stored at the second terminal 102b of the laser diode 102 are removed when the first control signal EN2 transitions from the second amplitude (e.g. HIGH) to the first amplitude (e.g. LOW), consequently decreasing the turn-off time of the laser diode 102. As an example, up until time t3, the second control signal EN3 is at the first amplitude (e.g. LOW). As such, the second terminal 116b of the capacitive element 116 is decoupled from the second terminal 102b of the laser diode 102, but coupled (e.g. via the PMOS transistor of the second switch 114) to the first reference voltage V1. Consequently, the capacitive element 116 is charged up (e.g. pre-charged to first reference voltage V1) between time t0 and time t3 and while the laser diode 102 is turned on and emits light. However, since the capacitive element 116 is effectively decoupled from the laser diode 102 during this period of time, the rise time of the output current of the laser diode 102 is not detrimentally affected (e.g. increased) by the capacitive element 116 of the snubber circuit 106.

However, when the first control signal EN2 transitions, at time t3, from the second amplitude (e.g. HIGH_1) to the first amplitude (e.g. LOW), the second control signal EN3 also transitions from the first amplitude (e.g. LOW) to the third amplitude (e.g. HIGH_2). As a result, the CMOS transistor is turned on while the PMOS transistor is turned off.

Consequently, the second terminal 116b of the capacitive element 116 is decoupled from the first reference voltage V1, but coupled (e.g. via the NMOS transistor of the second switch 114) to the second terminal 102b of the laser diode 102. This, in turn, results in a discharge of the capacitive element 116 and a rapid increase in the voltage of the second terminal 102b of the laser diode 102. In effect, this rapid increase in the voltage of the second terminal 102b of the laser diode 102 draws out remaining charged carriers from the diffusion capacitance within the forward-biased p-n junction of the laser diode 102, thus leading to a rapid turn off time for the laser diode 102 and improved turn off characteristics of the laser diode 102. In effect, the capacitive element 116 is decoupled from the laser diode 102 for a fast rising edge and settling when laser diode 102 is turned on, while the capacitive element 116 is coupled to the laser diode 102 for charge removal and for a fast falling edge when laser diode 102 is turning off.

Additionally, when the second control signal EN3 transitions from the first amplitude (e.g. LOW) to the third amplitude (e.g. HIGH_2), the source-to-drain resistance RDS of the NMOS transistor is arranged in series with the capacitive element 116. This arrangement has a low-pass filtering effect, which serves to damp RLC parasitic ringing of the output current (e.g. lasing current) of the laser diode 102 at turn off. It is noted that the inductance of the RLC parasitic ringing may be parasitic inductances of bond wires.

Figure 3:
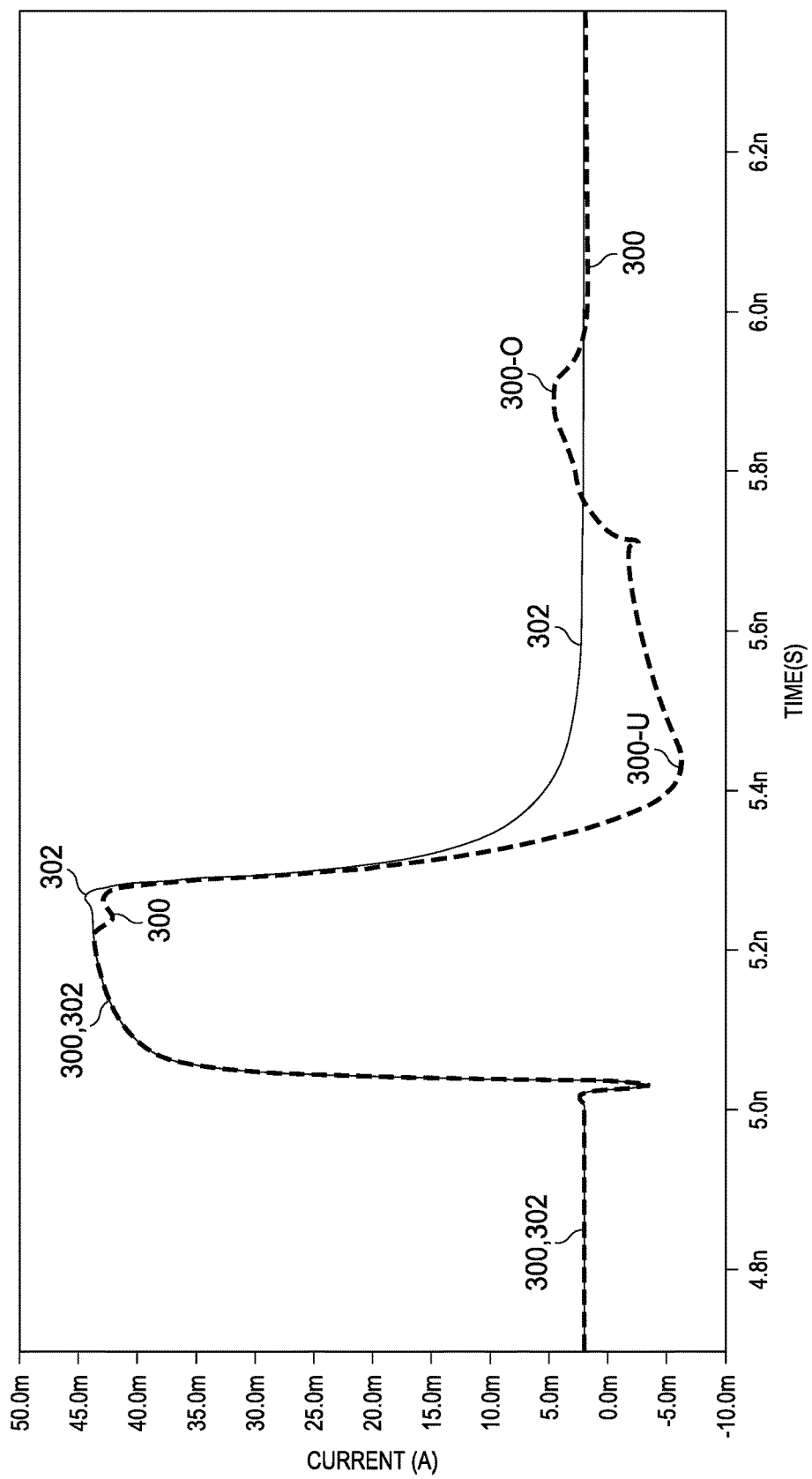
FIG. 3 shows a comparison of the output currents of the laser diode shown in FIG. 1 with and without the snubber circuit, in accordance with an embodiment.

FIG. 3 shows a comparison of the output currents of the laser diode 102 with and without the snubber circuit 106, in accordance with an embodiment. The vertical axis of the plot shown in FIG. 3 indicates the amplitude in milliamperes (mA), while the horizontal axis indicates time in nanoseconds (ns). In example of FIG. 3, the output current 300 denotes the output current of the laser diode 102 when snubber circuit 106 is operated in accordance with the timing diagram shown in FIG. 2. In particular, output current 300 shows the output current of the laser diode 102 when the capacitive element 116 is decoupled from the laser diode 102 when laser diode 102 is turned on and when the capacitive element 116 is coupled to the laser diode 102 when laser diode 102 is turning off. The output current 302, on the other hand, denotes the output current of the laser diode 102 without snubber circuit 106. In the example shown in FIG. 3, it is assumed that the first reference voltage V1 is between about 3 V and about 4 V (e.g. about 3.6 V), a junction capacitance of the p-n junction of the laser diode 102 is between about 2 pF and about 3 pF (e.g. about 2.4 pF), and the bias current provided by the current source 110 is about 2 mA.

As shown in the plots of FIG. 3, the output currents 300 and 302 have substantially equal rise times. As an example, the output currents 300 and 302 rise at a rate of about $2.4 \times 10^9$ A/s. On the other hand, the output current 300 obtained when snubber circuit 106 is operated in accordance with the timing diagram shown in FIG. 2 shows a steeper falling edge compared to the output current 302 obtained when snubber circuit 106 is not used. In other words, the output current 300 shows a faster turn off time (e.g. a steeper falling edge), compared to the output current 302 when snubber circuit 106 is operated in accordance with the timing diagram shown in FIG. 2. Furthermore, parasitic ringing following an undershoot 300-U in the fast falloff of the output current 300 is effectively damped by the above-described low-pass filtering effect that is achieved by having the source-to-drain resistance RDS of the NMOS transistor of the second switch 114 being arranged in series with the capacitive element 116. Even further, even though there may be an overshoot 300-O in the output current 300, such an overshoot 300-O may also be eliminated by tuning the duration for which the second control signal EN3 is at the third amplitude HIGH_2.

As described above, the capacitive element 116 may be trimmable. As such, the capacitance value and the time duration for which the snubber circuit 106 couples the capacitive element 116 to the second terminal 102b of the laser diode 102 may be selectable. The capacitance value and the time duration may be selected for tuning an optimal response for both damping the response and matching the junction capacitance of the laser diode 102.

Another effect of using the capacitive element 116 of the snubber circuit 106 as described above is that the laser diode 102 is not completely clamped off. In other words, a voltage difference between the first terminal 102a and the second terminal 102b of the laser diode 102 is greater than zero, even when laser diode 102 is not emitting light. Consequently, use of the snubber circuit 106 reduces the need to pre-charge any parasitic node capacitance which exists within the lasing current network. Thus, in effect, this contributes to a faster turn-on response for the laser diode 102.

Additionally, use of the capacitive element 116 of the snubber circuit 106 as described above allows for charge recovery, where the damped charge removed from the p-n junction of the laser diode 102 and stored within the capacitive element 116 is pumped back to the supply (e.g. the first reference voltage V1) when the first control signal EN2 is toggled back to the second amplitude (e.g. HIGH_1).

As such, the above-described implementation and use of the snubber circuit 106 in conjunction with the laser diode 102 may generate pulses from the laser diode 102 that resemble top-hat pulses with symmetrical rise and fall times. At a system level, pulses from the laser diode 102 that resemble top-hat pulses can aid in resolving an information carrying signal of a time-of-flight (ToF) return signal detected at a receiver (e.g. an SPAD-based optical receiver). In addition, the above-described use of the snubber circuit 106 in conjunction with the laser diode 102 produces an output current having a narrower pulse width (e.g. as shown in the comparisons of output currents 300 and 302 in FIG. 3). The narrower pulse widths of the output current of the laser diode 102 can lead to finer resolution of distances of a ToF signal. The narrower pulse widths of the output current of the laser diode 102 can increase signaling bandwidth and can also alleviate the problem of tight windowing in optical communications (e.g. when a narrow time window is needed to determine ambient noise).

FIG. 2 shows that the amplitude of the first control signal EN2 is changed between the first amplitude (e.g. LOW or 0 V) to the second amplitude (e.g. indicated as HIGH_1). FIG. 2 also shows that the amplitude of the second control signal EN3 is changed between the first amplitude (e.g. LOW or 0 V) to the third amplitude (e.g. indicated as HIGH_2). In some embodiments, the third amplitude HIGH_2 is greater than the second amplitude HIGH_1. As an example, the first switch 112 may have a power supply voltage between about 1 V and about 2 V. As such, the first control signal EN2 may reside in a first power domain where the second amplitude HIGH_1 is between about 1 V and about 2 V (e.g. about 1.1 V). On the other hand, the second switch 114 may have a power supply voltage between about 3 V and about 4 V. As such, the second control signal EN3 may reside in a second power domain where the third amplitude HIGH_2 is between about 3 V and about 4 V (e.g. about 3.3 V). An example of a component that resides the second power domain an analog front-end that generates signaling output.

In embodiments, where the third amplitude HIGH_2 is greater than the second amplitude HIGH_1, it may be desirable for a single circuit to generate both the first control signal EN2 and the second control signal EN3 so that the synchronization between the first control signal EN2 and the second control signal EN3 (as indicated in FIG. 2) may be achieved. For example, as described above, the first control signal EN2 may have a signaling frequency of at least about 1 GHz. Consequently, the second control signal EN3 may need to also have a signaling frequency of at least about 1 GHz so that the falling edge of the first control signal EN2 is synchronized or temporally aligned to the rising edge of the second control signal EN3. A mixed-voltage circuit (e.g. a level shifter) may be used to generate both the first control signal EN2 and the second control signal EN3 so that the synchronization between the first control signal EN2 and the second control signal EN3 (as indicated in FIG. 2) may be achieved.

Figure 4:
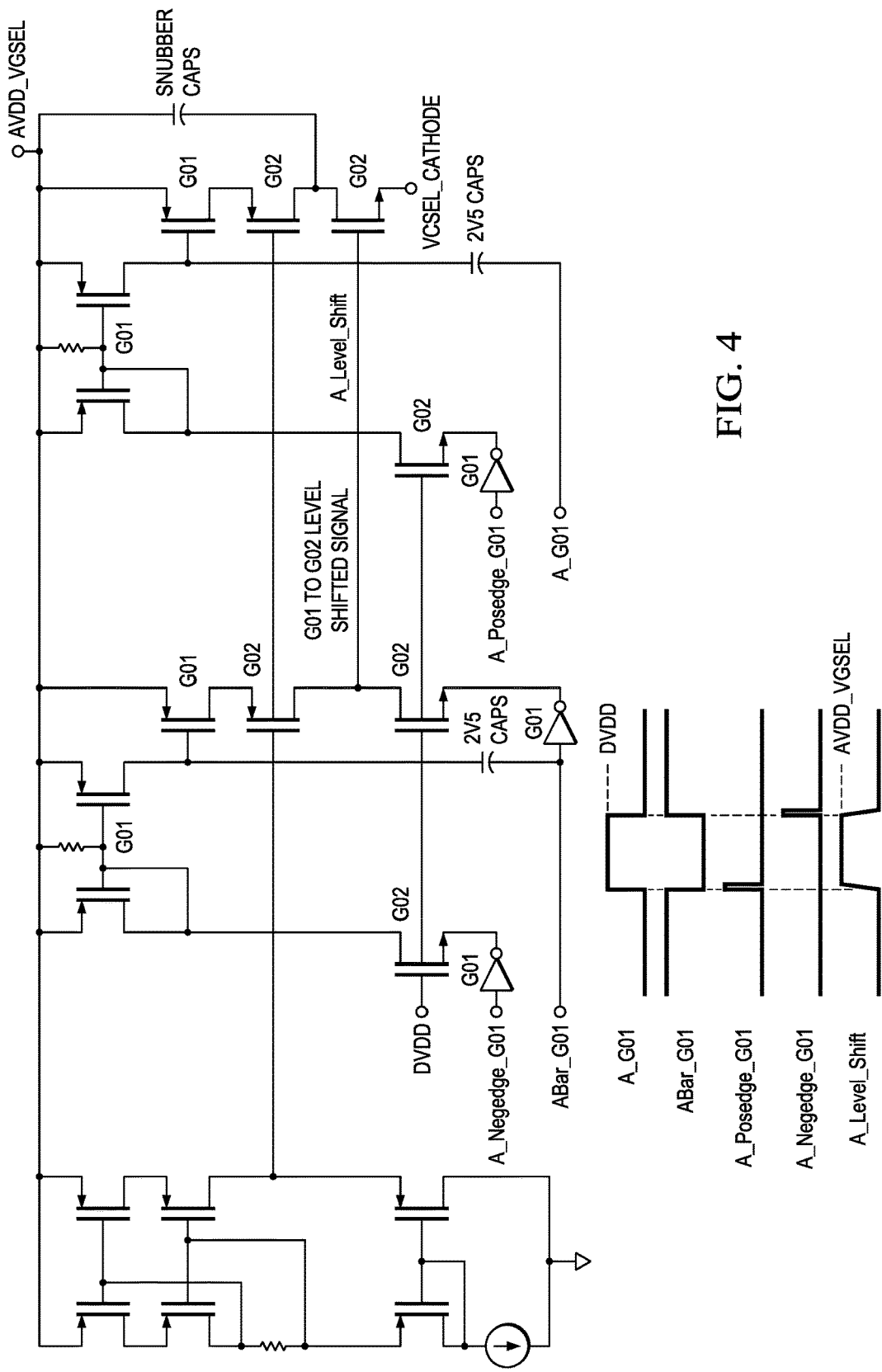
FIG. 4 shows an example of a level shifter that may be used to generate the control signals shown in FIG. 2, in accordance with an embodiment.

FIG. 4 shows an example of a level shifter 400 that may be used to generate the first control signal EN2 and the second control signal EN3, in accordance with an embodiment. In particular, the level shifter 400 may be a charge pump level shifter. Instead of positive feedback, the level shifter 400 implements level shifting using charge coupling capacitors (indicated in FIG. 4 as capacitors 2V5). The charge coupling capacitors 2V5 are tolerant to higher operating voltage than the voltage in the first power domain (where the supply voltage may be about 1.1 V, as described above). The charge coupling capacitors 2V5 are utilized for coupling a voltage level from the first power domain (where the supply voltage may be about 1.1 V) to the second power domain (where the supply voltage may be about 3.6 V).

As indicated in FIG. 4, devices that reside in the first power domain (labeled in FIG. 4 as GO1 devices) and devices that reside in the second power domain (labeled in FIG. 4 as GO2 devices) are protected with cascode devices that reside in the second power domain. The cascode devices residing in the second power domain allow for level-shifted voltage signaling for the second power domain (e.g. the second control signal EN3) from signaling for the first power domain (e.g. the first control signal EN2). It is noted that the use of labels GO2 and GO1 are in line with nomenclature describing a fabrication process. For example, devices labeled GO2 have thick gate oxides and are tolerant to larger operating voltages (e.g. to operating voltages that reside in the second power domain where the supply voltage may be about 3.6 V). Furthermore, devices labeled GO1 have thinner gate oxides (in comparison to GO2 devices) and are tolerant to smaller operating voltages (e.g. to operating voltages that reside in the first power domain where the supply voltage may be about 1.1 V). In some cases, GO2 devices include I/O devices that function as peripheral analog blocks interfacing a chip to the real world.

Figure 5:
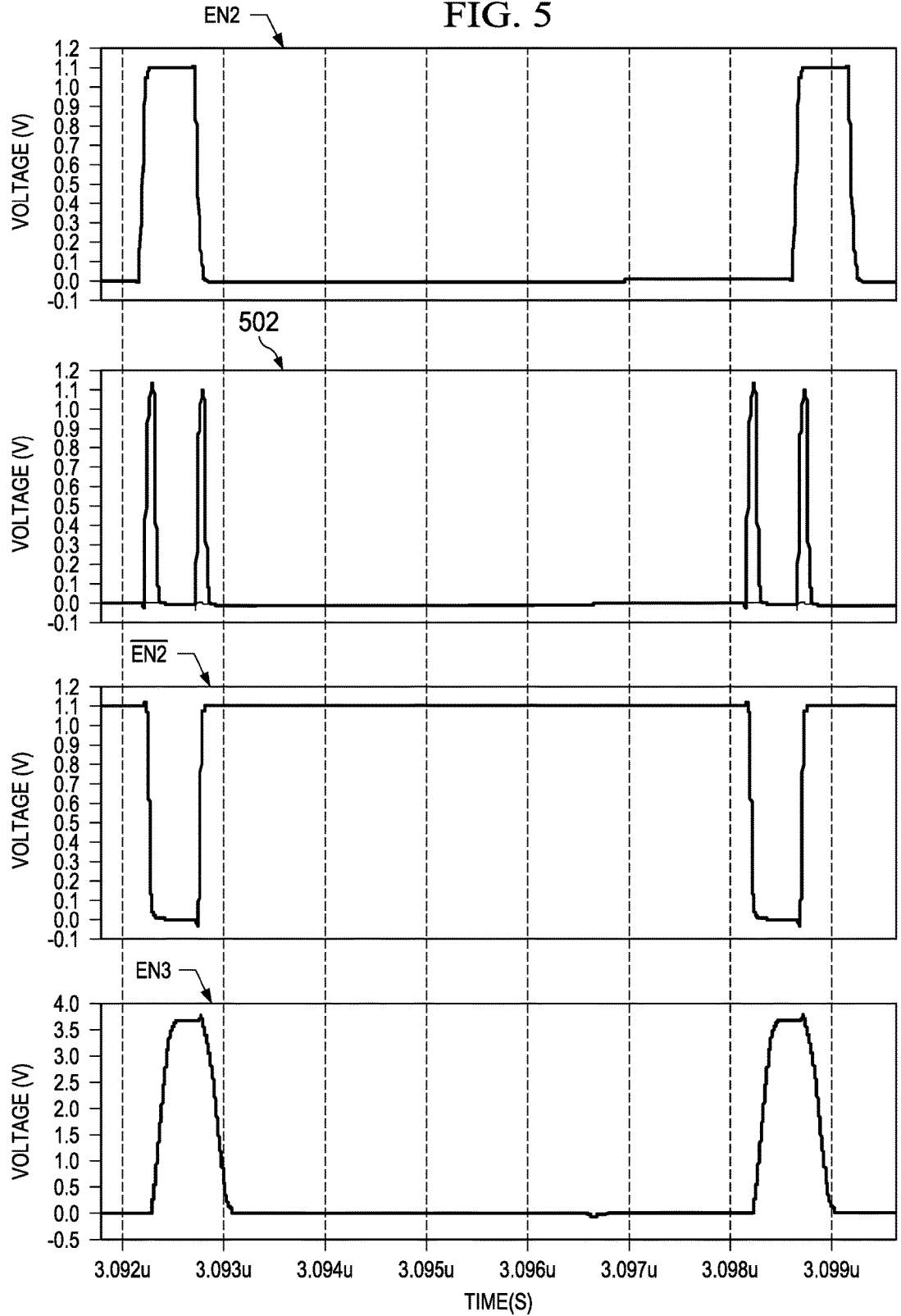
FIG. 5 shows a simulation plot of the control signals generated using the level shifter shown in FIG. 4, in accordance with an embodiment.

FIG. 5 shows a simulation plot of the first control signal EN2 and the second control signal EN3 generated using the level shifter 400 shown in FIG. 4, in accordance with an embodiment. The horizontal axis of the plots shown in FIG. 5 denotes time in microseconds, while the vertical axis denotes voltage in Volts. As shown in FIG. 5, the first control signal EN2 transitions from 0 V to about 1.1 V, while the second control signal EN3 transitions from about 0 V to about 3.6 V. Furthermore, since the first control signal EN2 is being generated and used by level shifter 400 to produce second control signal EN3, it is seen in FIG. 5 that the shape of the second control signal EN3 resembles the top-hat shape of the first control signal EN2. Furthermore, the frequency of the second control signal EN3 is substantially equal to the frequency of the first control signal EN2. Consequently, the synchronization between the second control signal EN3 and the first control signal EN2, as shown in FIG. 2, may be achieved (e.g. by use of a simple delay line to synchronize the falling edge of the first control signal EN2 with the rising edge of the second control signal EN3). FIG. 5 also shows a curve 502, which includes amplitude spikes that resemble dirac functions. The amplitude spikes are capped at the supply voltage of the first power domain (e.g. about 1.1 V) and occur at times coinciding with the falling and rising edges of the first control signal EN2.

Figure 6:
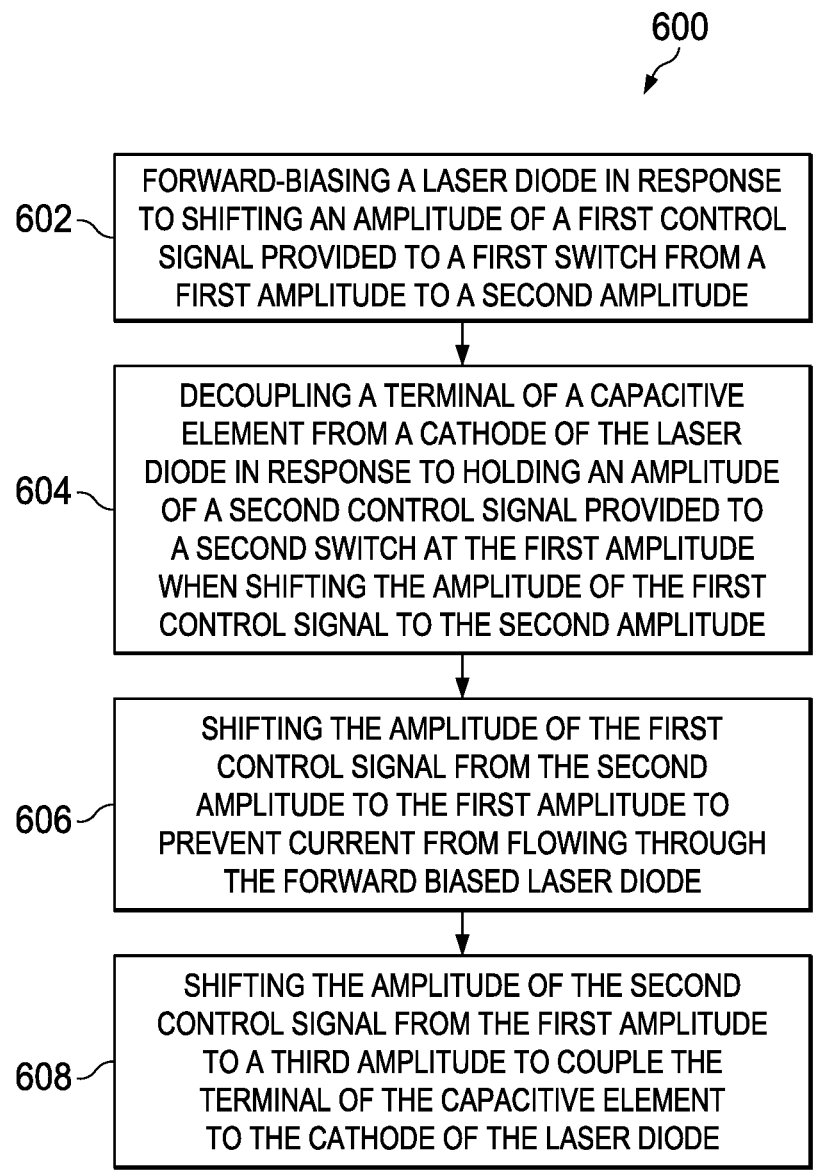
FIG. 6 shows a flow diagram illustrating a method of operating a laser diode, in accordance with an embodiment.

FIG. 6 shows a flow diagram illustrating a method 600 of operating the laser diode 102, in accordance with an embodiment. The method 600 includes step 602, which includes forward-biasing the laser diode 102 in response to shifting an amplitude of the first control signal EN2 provided to the first switch 112 from the first amplitude (e.g. LOW) to the second amplitude (e.g. HIGH_1). The method 600 further includes step 604, which includes decoupling a terminal 116b of the capacitive element 116 from the cathode 102b of the laser diode 102 in response to holding the amplitude of the second control signal EN3 provided to the second switch 114 at the first amplitude (e.g. LOW) when shifting the amplitude of the first control signal EN2 to the second amplitude (e.g. HIGH_1). The method 600 also includes step 606, which includes shifting the amplitude of the first control signal EN2 from the second amplitude (e.g. HIGH_1) to the first amplitude (e.g. LOW) to prevent current from flowing through the forward-biased laser diode 102. The method 600 additionally includes step 608, which includes shifting the amplitude of the second control signal EN3 from the first amplitude (e.g. LOW) to the third amplitude (e.g. HIGH_2) to couple the terminal 116b of the capacitive element 116 to the cathode 102b of the laser diode 102.

In summary, snubber circuit 106 draws out remaining charged carriers within a p-n junction of the laser diode 102, leading to a rapid turn off time for the laser diode 102. The snubber circuit 106 also serves to damp RLC parasitic ringing of an optical output current generated by the laser diode 102 at turn off. The snubber circuit 106 further allows for a non-zero voltage drop across the laser diode 102 even when laser diode 102 is not emitting light, thereby reducing the need to pre-charge any parasitic node capacitance that exists within the laser diode 102, thus leading to a faster turn-on response for the laser diode 102. The snubber circuit 106 additionally allows for charge recovery, where the damped charge removed from the p-n junction of the laser diode 102 is pumped back to the power supply V1.

In an embodiment, a circuit includes a diode having a first terminal coupled to a first reference voltage; a first controllable switch coupled between a second terminal of the diode and a second reference voltage; and a capacitive element having a first terminal coupled to the first reference voltage and a second terminal controllably coupled to the second terminal of the diode.

In an embodiment, a circuit includes a current source; a laser diode coupled between a first terminal of the current source and a first reference voltage; and a first switch controlled by a first control signal and coupled between a second terminal of the current source and a second reference voltage, the second reference voltage being less than the first reference voltage. The circuit further includes a capacitive element having a first terminal coupled to the first reference voltage; and a second switch having a first terminal coupled to a cathode of the laser diode and a second terminal coupled to a second terminal of the capacitive element. The second switch may be configured to couple the second terminal of the capacitive element to the first reference voltage in response to a second control signal being at a first voltage, and to couple the second terminal of the capacitive element to the cathode of the laser diode in response to the second control signal being at a second voltage different from the first voltage.

In an embodiment, a method includes forward-biasing a laser diode in response to shifting an amplitude of a first control signal provided to a first switch from a first amplitude to a second amplitude and decoupling a terminal of a capacitive element from a cathode of the laser diode in response to holding an amplitude of a second control signal provided to a second switch at the first amplitude when shifting the amplitude of the first control signal to the second amplitude. The method further includes shifting the amplitude of the first control signal from the second amplitude to the first amplitude to prevent current from flowing through the forward-biased laser diode; and shifting the amplitude of the second control signal from the first amplitude to a third amplitude to couple the terminal of the capacitive element to the cathode of the laser diode.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit, comprising:
   a diode having a first terminal coupled to a first reference voltage;
   a first controllable switch coupled between a second terminal of the diode and a second reference voltage;
   a capacitive element having a first terminal coupled to the first reference voltage and a second terminal controllably coupled to the second terminal of the diode; and
   a second controllable switch having a first terminal, a second terminal, and a third terminal, wherein:
     the first terminal of the second controllable switch is coupled to the second terminal of the diode;
     the second terminal of the second controllable switch is coupled to the second terminal of the capacitive element; and
     the third terminal of the second controllable switch is coupled to the first reference voltage.

2. The circuit of claim 1, wherein the diode comprises a laser diode.

3. The circuit of claim 2, wherein the laser diode comprises a vertical cavity surface emitting laser.

4. The circuit of claim 1, further comprising a controllable current source coupled between the second terminal of the diode and the first controllable switch.

5. The circuit of claim 1, wherein the first terminal and the second terminal of the diode comprise an anode and a cathode of the diode, respectively.

6. The circuit of claim 1, wherein an operation of the first controllable switch and the second controllable switch are controlled by a first control signal and a second control signal, respectively.

7. The circuit of claim 6, wherein a falling edge of the first control signal is synchronized with a rising edge of the second control signal.

8. The circuit of claim 6, wherein a time difference between rising edges of consecutive pulses of the first control signal is less than or equal to about 1 ns.

9. The circuit of claim 6, wherein a maximum amplitude of the first control signal is less than a maximum amplitude of the second control signal.

10. The circuit of claim 9, wherein the maximum amplitude of the first control signal is between about 1 V and about 2 V, and wherein the maximum amplitude of the second control signal is between about 3 V and about 4 V.

11. A circuit, comprising:
    a current source;
    a laser diode coupled between a first terminal of the current source and a first reference voltage;
    a first switch controlled by a first control signal and coupled between a second terminal of the current source and a second reference voltage, the second reference voltage being less than the first reference voltage;

a capacitive element having a first terminal coupled to the first reference voltage; and a second switch having a first terminal coupled to a cathode of the laser diode and a second terminal coupled to a second terminal of the capacitive element, the second switch being configured to couple the second terminal of the capacitive element to the first reference voltage in response to a second control signal being at a first voltage, and to couple the second terminal of the capacitive element to the cathode of the laser diode in response to the second control signal being at a second voltage different from the first voltage.

12. The circuit of claim 11, wherein the first switch is configured to couple the current source to the second reference voltage when the second terminal of the capacitive element is coupled to the first reference voltage.

13. The circuit of claim 11, wherein the first switch is configured to decouple the current source from the second reference voltage when the second terminal of the capacitive element is coupled to the cathode of the laser diode.

14. The circuit of claim 11, wherein a rising edge of the second control signal is temporally aligned to a falling edge of the first control signal.

15. The circuit of claim 11, wherein the second switch comprises a first transistor having a first conductivity type and a second transistor having a second conductivity type, the first transistor having a drain coupled to the first reference voltage and a source coupled to the second terminal of the capacitive element, the second transistor having a drain coupled to the second terminal of the capacitive element and a source coupled to the cathode of the laser diode, and wherein the second control signal is provided to gates of the first transistor and the second transistor.

16. The circuit of claim 15, wherein the first transistor and the second transistor comprise a PMOS transistor and an NMOS transistor, respectively.

17. A method, comprising:
forward-biasing a laser diode in response to shifting an amplitude of a first control signal provided to a first switch from a first amplitude to a second amplitude;

decoupling a terminal of a capacitive element from a cathode of the laser diode in response to holding an amplitude of a second control signal provided to a second switch at the first amplitude when shifting the amplitude of the first control signal to the second amplitude;

shifting the amplitude of the first control signal from the second amplitude to the first amplitude to prevent current from flowing through the forward-biased laser diode; and shifting the amplitude of the second control signal from the first amplitude to a third amplitude to couple the terminal of the capacitive element to the cathode of the laser diode.

18. The method of claim 17, wherein shifting the amplitude of the second control signal from the first amplitude to the third amplitude coincides in time with shifting the amplitude of the first control signal from the second amplitude to the first amplitude.

19. The method of claim 17, wherein the third amplitude is greater than the second amplitude.

20. The method of claim 19, wherein the third amplitude is about 3.6 V and the second amplitude is about 1.1 V.

21. The method of claim 17, wherein the first amplitude is about 0 V.

22. The method of claim 17, wherein holding the amplitude of the second control signal provided to the second switch at the first amplitude couples the terminal of the capacitive element to a first reference voltage.

* * * * *